(12) United States Patent
Ng et al.

(10) Patent No.: US 11,755,806 B2
(45) Date of Patent: Sep. 12, 2023

(54) SYSTEMS AND METHODS FOR EXECUTING A PROGRAMMABLE FINITE STATE MACHINE THAT ACCELERATES FETCHLESS COMPUTATIONS AND OPERATIONS OF AN ARRAY OF PROCESSING CORES OF AN INTEGRATED CIRCUIT

(71) Applicant: quadric.io Inc., Burlingame, CA (US)

(72) Inventors: Thomas Ng, Burlingame, CA (US); Nigel Drego, Burlingame, CA (US); Daniel Firu, Burlingame, CA (US); Veerbhan Kheterpal, Burlingame, CA (US); Aman Sikka, Burlingame, CA (US)

(73) Assignee: quadric.io, Inc., Burlingame, CA (US)

( * ) Notice: Subject to any disclaimer, the term of this patent is extended or adjusted under 35 U.S.C. 154(b) by 0 days.

(21) Appl. No.: 17/953,312

(22) Filed: Sep. 26, 2022

(65) Prior Publication Data

US 2023/0055528 A1 Feb. 23, 2023

Related U.S. Application Data

(60) Provisional application No. 63/407,258, filed on Sep. 16, 2022, provisional application No. 63/235,775, filed on Aug. 22, 2021.

(51) Int. Cl.
*G06F 30/343* (2020.01)

(52) U.S. Cl.
CPC .............................. *G06F 30/343* (2020.01)

(58) Field of Classification Search
CPC .................................................. G06F 30/343
See application file for complete search history.

*Primary Examiner* — Jack Chiang
*Assistant Examiner* — Aric Lin
(74) *Attorney, Agent, or Firm* — Padowithz Alce; Alce PLLC (57) ABSTRACT

Systems and methods for fetchless acceleration of convolutional loops on an integrated circuit include identifying, by a compiler, finite state machine (FSM) initialization parameters based on computational requirements of a computational loop; initializing a programmable FSM based on the FSM initialization parameters, wherein the FSM initialization parameters include a loop iteration parameter identifying a number of computation cycles of the computational loop; executing the programmable FSM to enable fetchless computations by: generating a plurality of computational loop control signals including a distinct computation loop control signal for each of the number of computation cycles of the computational loop based on the loop iteration parameter; and controlling an execution of a plurality of computation cycles of a computational circuit performing the computational loop based on transmitting the plurality of computational loop control signals until the number of computation cycles of the computation loop are completed.

18 Claims, 6 Drawing Sheets

Identifying FSM Initialization Parameters S210

Initializing a Programmable FSM S220

Executing the Pragrammable FSM S230

Implementing FSM-Controlled Fetchless Computations S240

SYSTEMS AND METHODS FOR EXECUTING A PROGRAMMABLE FINITE STATE MACHINE THAT ACCELERATES FETCHLESS COMPUTATIONS AND OPERATIONS OF AN ARRAY OF PROCESSING CORES OF AN INTEGRATED CIRCUIT

CROSS-REFERENCE TO RELATED APPLICATIONS

This application claims the benefit of U.S. Provisional Application No. 63/235,775, filed 22 Aug. 2021, which are incorporated herein in their entireties by this reference.

TECHNICAL FIELD

The one or more inventions described herein relate generally to the integrated circuitry field, and more specifically to a new and useful perception and dense algorithm processing integrated circuitry architecture in the integrated circuitry field.

BACKGROUND

Modern applications of artificial intelligence and generally, machine learning appear to be driving innovations in robotics and specifically, in technologies involving autonomous robotics and autonomous vehicles. Also, the developments in machine perception technology have enabled the abilities of many of the implementations in the autonomous robotics' and autonomous vehicles' spaces to perceive vision, perceive hearing, and perceive touch among many other capabilities that allow machines to comprehend their environments.

The underlying perception technologies applied to these autonomous implementations include a number of advanced and capable sensors that often allow for a rich capture of environments surrounding the autonomous robots and/or autonomous vehicles. However, while many of these advanced and capable sensors may enable a robust capture of the physical environments of many autonomous implementations, the underlying processing circuitry that may function to process the various sensor signal data from the sensors often lack in corresponding robust processing capabilities sufficient to allow for high performance and real-time computing of the sensor signal data.

The underlying processing circuitry often include general purpose integrated circuits including central processing units (CPUs) and graphic processing units (GPU). In many applications, GPUs are implemented rather than CPUs because GPUs are capable of executing bulky or large amounts of computations relative to CPUs. However, the architectures of most GPUs are not optimized for handling many of the complex machine learning algorithms (e.g., neural network algorithms, etc.) used in machine perception technology. For instance, the autonomous vehicle space includes multiple perception processing needs that extend beyond merely recognizing vehicles and persons. Autonomous vehicles have been implemented with advanced sensor suites that provide a fusion of sensor data that enable route or path planning for autonomous vehicles. But modern GPUs are not constructed for handling these additional high computation tasks.

At best, to enable a GPU or similar processing circuitry to handle additional sensor processing needs including path planning, sensor fusion, and the like, additional and/or disparate circuitry may be assembled to a traditional GPU. This fragmented and piecemeal approach to handling the additional perception processing needs of robotics and autonomous machines results in a number of inefficiencies in performing computations including inefficiencies in sensor signal processing.

Accordingly, there is a need in the integrated circuitry field for an advanced integrated circuit and processing techniques that are capable of high performance and real-time processing and computing of routine and advanced sensor signals for enabling perception of robotics or any type or kind of perceptual machine.

The inventors of the inventions described in the present application have designed an integrated circuit architecture and one or more processing techniques that allow for enhanced sensor data processing capabilities and have further discovered related methods for implementing the integrated circuit architecture for several purposes including for enabling perception of robotics and various machines.

BRIEF SUMMARY OF THE INVENTION(S)

In one embodiment, a method for fetchless acceleration of convolutional loops on an integrated circuit includes identifying, by a compiler, finite state machine (FSM) initialization parameters based on convolution requirements of one or more convolutional loops within a neural network graph; initializing a programmable FSM based on the FSM initialization parameters, wherein the FSM initialization parameters include at least a loop iteration parameter comprising a required number of computation cycles of a convolutional loop; at runtime, implementing the programmable FSM to fetchless computations by: (i) generating a plurality of convolutional loop control signals based on the FSM initialization parameters; and (ii) transmitting the plurality of convolutional loop control signals to one or more matrix accumulator circuits (MACs) of a plurality of distinct processing cores; and controlling, by the programmable FSM, an execution of a plurality of computation cycles of the one or more MACs performing a convolutional loop until a number of computation cycles of the convolutional loop is completed.

In one embodiment, initializing the programmable FSM based on the FSM initialization parameters includes: (i) programming a starting memory address parameter at a start memory address register file of the programmable FSM; (ii)

programming a convolution filter size parameter at a convolution register file of the programmable FSM; and (iii) programming iteration parameters at an iteration register file of the programmable FSM.

In one embodiment, the programmable FSM is in direct command signal communication with each of the plurality of distinct processing cores of an array of processing cores.

In one embodiment, the method includes identifying, by the compiler, FSM initialization parameters includes: computing a memory start address parameter identifying a memory address location within a local memory of each of the plurality of distinct processing cores.

In one embodiment, a method for implementing FSM-controlled convolutional computations on an integrated circuit includes identifying FSM programming instructions based on a neural network graph; configuring a programmable FSM based on the FSM programming instructions, wherein the programmable FSM controls: (a) operations of multiply accumulators of a plurality of distinct processing cores, and (b) operations of data ports of the plurality of distinct processing cores; and wherein configuring the programmable FSM includes: (1) initializing an address register file of the FSM with a starting memory address value, (2) initializing a convolutional register file of the FSM with a convolutional filter size value; (3) initializing at least one iteration register file of the programmable FSM with an iteration value identifying a number of cycles of a convolutional loop performed by the multiply accumulators; based on the initialization of the programmable FSM, starting the programmable FSM causing the programmable FSM to generate control signals to the plurality of distinct processing cores based the programming of at least the at least one iteration register file.

In one embodiment, a method for implementing fetchless acceleration of computational loops on an integrated circuit includes identifying, by a compiler, finite state machine (FSM) initialization parameters based on computational requirements of a computational loop within a neural network graph; initializing a programmable FSM based on the FSM initialization parameters, wherein the FSM initialization parameters include a loop iteration parameter including a number of computation cycles of the computational loop; at runtime, implementing the programmable FSM to enable fetchless computations by: (i) generating, by the programmable FSM, a plurality of computational loop control signals including a distinct computation loop control signal for each of the number of computation cycles of the computational loop based on the loop iteration parameter; and (ii) controlling, by the programmable FSM, an execution of a plurality of computation cycles of a computational circuit performing the computational loop based on transmitting the plurality of computational loop control signals until the number of computation cycles of the computation loop are completed.

In one embodiment, the FSM initialization parameters further includes a loop iteration and data movement parameter including (a) a distinct number of computation cycles of the computation loop and (b) at least one data movement instruction that, when executed, moves input data from a first register file of a processing core to a second register file of the processing core.

In one embodiment, the first register file is associated with a first data port of the processing core and the second register file is associated with a second data port of the processing; and when the data movement instruction is executed causes the input data rotate an angle from the first data port to the second data port.

In one embodiment, implementing the programmable FSM includes: generating, by the programmable FSM, a data movement control signal for each distinct number of computation cycles of the computation loop based on the loop iteration and data movement parameter.

In one embodiment, controlling the execution of the plurality of computation cycles of the computational circuit includes transmitting, by the programmable FSM, the data movement control signal for each distinct number of computation cycles until the distinct number of computation cycles of the computation loop are completed.

In one embodiment, initializing the programmable FSM based on the FSM initialization parameters includes encoding a starting memory address parameter to a start memory address register file accessible to one or more computational circuits controllable by the programmable FSM.

In one embodiment, the starting memory address parameter includes a register file pointer that points to a head of the input data at a location within an n-dimensional memory stored within at least one processing core controllable by the programmable FSM.

In one embodiment, initializing the programmable FSM based on the FSM initialization parameters includes encoding a convolution filter size parameter to a convolution register file of at least one processing core controllable by the programmable FSM.

In one embodiment, the convolution filter size parameter includes a value that maps to one of a plurality of distinct convolutional filter sizes for a given convolutional computation by a multiply accumulator circuit of the at least one processing core.

In one embodiment, initializing the programmable FSM based on the FSM initialization parameters includes encoding the loop iteration parameter to a combination of distinct iteration register files of at least one processing core controllable by the programmable FSM.

In one embodiment, at runtime, the programmable FSM executes the computational loop based on the loop iteration parameter, and subsequently, the programmable FSM executes one or more computational loops based on the loop iteration and data movement parameter.

In one embodiment, at runtime, the programmable FSM produces: a first set of control signals of the plurality of computational loop control signals for executing the computational loop based on the loop iteration parameter; and in response to completing the computational loop based on the loop iteration parameter, a second set of control signals of the plurality of computational loop control signals for executing (a) the distinct number of computation cycles of the computation loop and (b) the at least one data movement instruction based on the loop iteration and data movement parameter.

In one embodiment, at runtime, the programmable FSM produces the plurality of controls signals causing an execution of an N-way multiply accumulate with computation weights and computation input data, N relates to a number of distinct multiply accumulate circuits concurrently executing a distinct computational loop, and N is greater than one.

In one embodiment, if convolutional filter size parameter of the FSM initialization parameters includes a value that maps to one of a plurality of distinct convolutional filter sizes that is greater than a 1×1 convolutional filter size, the programmable FSM broadcasts input data pointed to by the starting memory address parameter to a collection of processing cores in neighboring proximity.

In one embodiment, a method for implementing fetchless acceleration of convolutional loops on an integrated circuit includes identifying, by a compiler, finite state machine (FSM) initialization parameters based on computational requirements of a convolutional loop within a neural network graph; initializing a programmable FSM based on the FSM initialization parameters, wherein the FSM initialization parameters include a loop iteration parameter including a number of computation cycles of the convolutional loop; at runtime, implementing the programmable FSM to enable fetchless computations by: (i) generating, by the programmable FSM, a plurality of convolutional loop control signals based on the loop iteration parameter; and (ii) controlling, by the programmable FSM, an execution of a plurality of computation cycles of a multiply accumulator circuit (MAC) performing the convolutional loop based on transmitting the plurality of convolutional loop control signals until the number of computation cycles of the computation loop are completed.

In one embodiment, initializing the programmable FSM based on the FSM initialization parameters includes: (i) programming a starting memory address parameter at a start memory address register file accessible to the MAC controllable by the programmable FSM; (ii) programming a convolution filter size parameter at a convolution register file accessible to the MAC controllable by the programmable FSM; and (iii) programming iteration parameters at one or more iteration registers file accessible to the programmable FSM.

In one embodiment, the programmable FSM is in direct command signal communication with a plurality of distinct MACS operating on each of a plurality of distinct processing cores.

In one embodiment, the method includes identifying, by the compiler, FSM initialization parameters includes: computing a memory start address parameter including a memory address location within a local memory of each of the plurality of distinct processing cores.

In one embodiment, a method for implementing FSM-controlled convolutional computations on an integrated circuit includes identifying FSM programming instructions based on a neural network graph; configuring a programmable FSM based on the FSM programming instructions, wherein the programmable FSM controls: (a) operations of multiply accumulators (MACs) of a plurality of distinct processing cores, and (b) data movement operations of data ports of the plurality of distinct processing cores; and wherein configuring the programmable FSM includes: (1) programming a starting memory address value to an address register file accessible to MACs controllable by the programmable FSM, (2) programming a convolutional filter size to a convolutional register file associated with the FSM, and (3) programming at least one iteration register file associated with the programmable FSM with an iteration value identifying a number of cycles of a convolutional loop performed by at least one of the MACs; and executing a Boolean switch based on the initialization of the programmable FSM that starts an operation of the programmable FSM for generating control signals to the MACs for automatically executing distinct convolutional loops.

DESCRIPTION OF THE PREFERRED EMBODIMENTS

The following description of preferred embodiments of the present application are not intended to limit the inventions to these preferred embodiments, but rather to enable any person skilled in the art to make and use these inventions.

Overview

In one or more embodiments of the present application, the systems and techniques described herein may allow for enhanced scheduling and execution of data transfers and computations, in parallel, that reduces latency in the one or more processes of an integrated circuit. In such embodiments, a scheduling of a plurality of memory transfers of inputs and outputs of computations of a computations network graph may be made in such a manner that enables overlaps with computations.

In the one or more embodiments, the methods and systems may function to configure an on-chip memory or data buffer that interfaces with array processing cores of the integrated circuit. In embodiments such as these, the inputs for compute are preferably stored in the OCM and are sourced to the array processing cores and the outputs of the computers are preferably transferred from the array processing cores to and stored by the OCM. Since in some circumstances, the content of the OCM may function to dictate the amount of compute that can be performed by the array processing cores. Because of this, the one or more embodiments of the present application provide systems and techniques that configures the OCM to optimize for both memory transfers and computations. That is, rather than sequential memory transfers to the OCM and subsequent computations based on the memory content of the OCM, the memory transfers are optimized for multiple parallel transfers into the OCM from a main memory based on the computation requirements of the array processing cores and the computations of the array processing cores may be accelerated based on partial dependency encodings of the OCM that allow computations to be performed by the OCM with only partial inputs stored in the OCM.

At least a few technical benefits of the above-noted embodiments of the present application includes the continuous and uninterrupted computations of the array processing cores based on the encoded partial dependencies of the OCM and the continuous and uninterrupted memory transfers of inputs and outputs without the need to wait on the completion of the one or more computations at the array processing cores.

It shall also be recognized that the one or more embodiments of the present application may be implemented in any suitable processing environment including, but not limited to, within one or more IMDs and/or any suitable processing circuit.

The mesh architecture defined by the plurality of processing elements in the array core preferably enable in-memory computing and data movement, as described in U.S. Pat. No. 10,365,860 and U.S. patent application Ser. No. 16/292,537, which are incorporated herein in their entireties by this reference and further, enable a core-level predication and a tile-level predication.

1. A System Architecture of a Dense Algorithm and/or Perception Processing Circuit (Unit)

Figure 1:
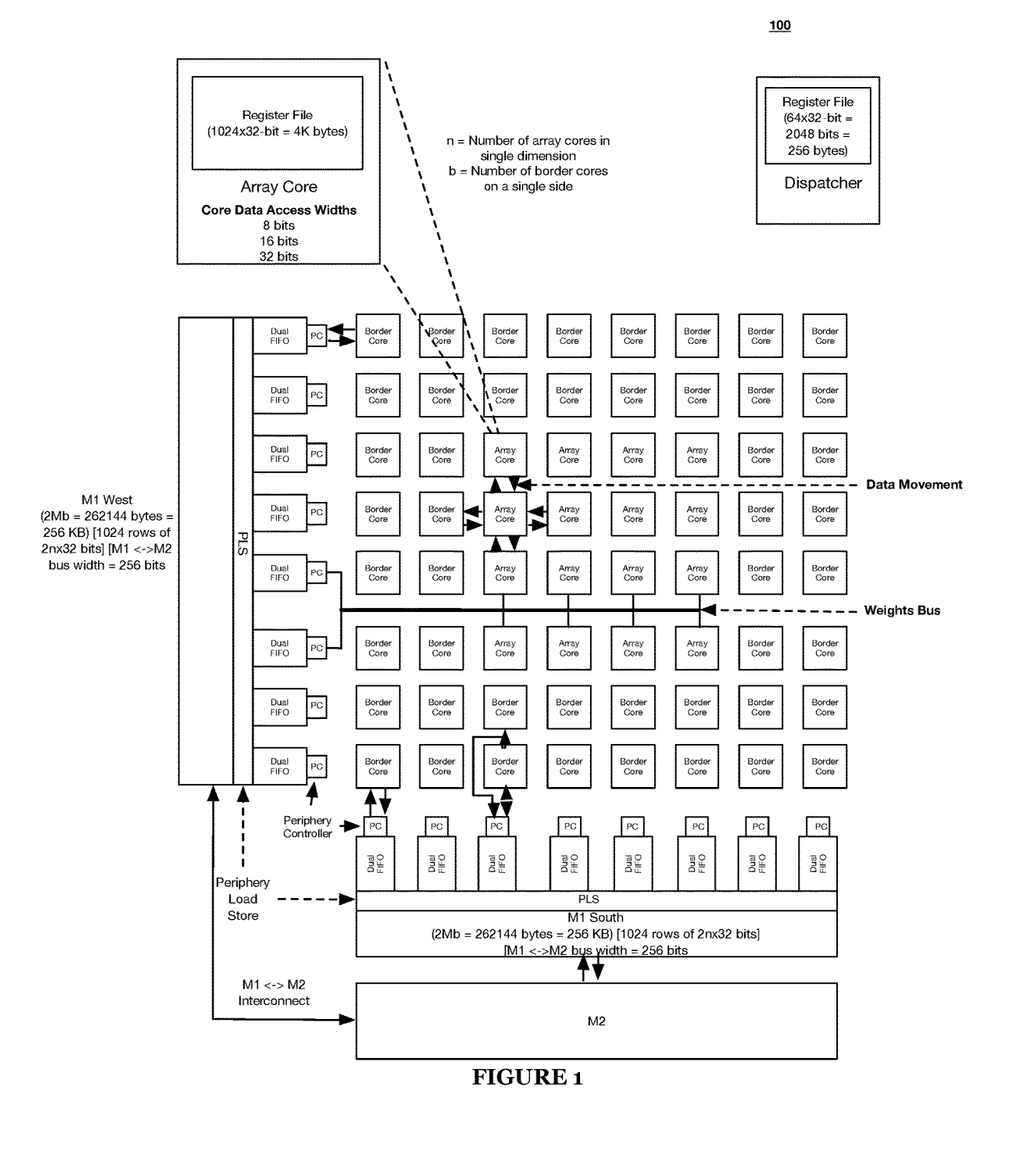
FIG. 1 illustrates a schematic of a system 100 in accordance with one or more embodiments of the present application.

As shown in FIG. 1, the integrated circuit 100 (dense algorithm and/or perception processing unit) for performing perception processing includes a plurality of array cores 110, a plurality of border cores 120, a dispatcher (main controller) 130, a first plurality of periphery controllers 140, a second plurality of periphery controllers 150, and main memory 160. The integrated circuit 100 may additionally include a first periphery load store 145, a second periphery load store 155, a first periphery memory 147, a second periphery memory 157, a first plurality of dual FIFOs 149, and a second plurality of dual FIFOs 159, as described in U.S. Pat. Nos. 10,365,860, 10,691,464, and U.S. patent application Ser. No. 16/292,537, which are all incorporated herein in their entireties by this reference.

The integrated circuit 100 preferably functions to enable real-time and high computing efficiency of perception data and/or sensor data. A general configuration of the integrated circuit 100 includes a plurality of array core 110 defining central signal and data processing nodes each having large register files that may eliminate or significantly reduce clock cycles needed by an array core no for pulling and pushing data for processing from memory. The instructions (i.e., computation/execution and data movement instructions) generating capabilities of the integrated circuit 100 (e.g., via the dispatcher 130 and/or a compiler module 175) functions to enable a continuity and flow of data throughout the integrated circuit 100 and namely, within the plurality of array cores no and border cores 120.

An array core no preferably functions as a data or signal processing node (e.g., a small microprocessor) or processing circuit and preferably, includes a register file 112 having a large data storage capacity (e.g., 1024 kb, etc.) and an arithmetic logic unit (ALU) 118 or any suitable digital electronic circuit that performs arithmetic and bitwise operations on integer binary numbers. In a preferred embodiment, the register file 112 of an array core no may be the only memory element that the processing circuits of an array core no may have direct access to. An array core no may have indirect access to memory outside of the array core and/or the integrated circuit array 105 (i.e., core mesh) defined by the plurality of border cores 120 and the plurality of array cores no.

The register file 112 of an array core 110 may be any suitable memory element or device, but preferably comprises one or more static random-access memories (SRAMs). The register file 112 may include a large number of registers, such as 1024 registers, that enables the storage of a sufficiently large data set for processing by the array core 110. Accordingly, a technical benefit achieved by an arrangement of the large register file 112 within each array core no is that the large register file 112 reduces a need by an array core 110 to fetch and load data into its register file 112 for processing. As a result, a number of clock cycles required by the array core 112 to push data into and pull data out of memory is significantly reduced or eliminated altogether. That is, the large register file 112 increases the efficiencies of computations performed by an array core no because most, if not all, of the data that the array core no is scheduled to process is located immediately next to the processing circuitry (e.g., one or more MACs, ALU, etc.) of the array core no. For instance, when implementing image processing by the integrated circuit 100 or related system using a neural network algorithm(s) or application(s) (e.g., convolutional neural network algorithms or the like), the large register file 112 of an array core may function to enable a storage of all the image data required for processing an entire image. Accordingly, most or if not, all layer data of a neural network implementation (or similar compute-intensive application) may be stored locally in the large register file 112 of an array core no with the exception of weights or coefficients of the neural network algorithm(s), in some embodiments. Accordingly, this allows for optimal utilization of the computing and/or processing elements (e.g., the one or more MACs and ALU) of an array core no by enabling an array core no to not constantly churn data of the register file 112 and further, limiting the fetching and loading of data from an off-array core data source (e.g., main memory, periphery memory, etc.).

By comparison, to traverse a register file in a traditional system implemented by a GPU or the like, it is typically required that memory addresses be issued for fetching data from memory. However, in a preferred embodiment that implements the large register file 112, the (raw) input data within the register file 112 may be automatically incremented from the register file 112 and data from neighboring core(s) (e.g., array cores and/or border cores) are continuously sourced to the register file 112 to enable a continuous flow to the computing elements of the array core no without an express need to make a request (or issuing memory addresses) by the array core no.

While in some embodiments of the present application, a predetermined data flow scheduled may mitigate or altogether, eliminate requests for data by components within the integrated circuit array 105, in a variant of these embodiments traditional random memory access may be achieved by components of the integrated circuit array 105. That is, if an array core no or a border core 120 recognizes a need for a random piece of data for processing, the array core no and/or the border 120 may make a specific request for data from any of the memory elements within the memory hierarchy of the integrated circuit 100.

An array core no may, additionally or alternatively, include a plurality of multiplier (multiply) accumulators (MACs) 114 or any suitable logic devices or digital circuits that may be capable of performing multiply and summation functions. In a preferred embodiment, each array core no includes four (4) MACs and each MAC 114 may be arranged at or near a specific side of a rectangular shaped array core no. While, in a preferred embodiment each of the plurality of MACs 114 of an array core 110 may be arranged near or at the respective sides of the array core 110, it shall be known that the plurality of MACs 114 may be arranged within (or possibly augmented to a periphery of an array core) the array core no in any suitable arrangement, pattern, position, and the like including at the respective corners of an array core 110. In a preferred embodiment, the arrangement of the plurality of MACs 114 along the sides of an array core no enables efficient inflow or capture of input data received from one or more of the direct neighboring cores (i.e., an adjacent neighboring core) and the computation thereof by the array core no of the integrated circuit 100.

Accordingly, each of the plurality of MACs 114 positioned within an array core no may function to have direct communication capabilities with neighboring cores (e.g., array cores, border cores, etc.) within the integrated circuit 100. The plurality of MACs 114 may additionally function to execute computations using data (e.g., operands) sourced from the large register file 112 of an array core no. However, the plurality of MACs 114 preferably function to source data for executing computations from one or more of their respective neighboring core(s) and/or a weights or coefficients (constants) bus 116 that functions to transfer coefficient or weight inputs of one or more algorithms (including machine learning algorithms) from one or more memory elements (e.g., main memory 160 or the like) or one or more input sources.

The weights bus 116 may be operably placed in electrical communication with at least one or more of periphery controllers 140, 150 at a first input terminal and additionally, operably connected with one or more of the plurality of array core 110. In this way, the weight bus 116 may function to collect weights and coefficients data input from the one or more periphery controllers 140, 150 and transmit the weights and coefficients data input directly to one or more of the plurality of array cores 110. Accordingly, in some embodiments, multiple array cores no may be fed weights and/or coefficients data input via the weights bus 116 in parallel to thereby improve the speed of computation of the array cores no.

Each array core no preferably functions to bi-directionally communicate with its direct neighbors. That is, in some embodiments, a respective array core 110 may be configured as a processing node having a rectangular shape and arranged such that each side of the processing node may be capable of interacting with another node (e.g., another processing node, a data storage/movement node, etc.) that is positioned next to one of the four sides or each of the faces of the array core no. The ability of an array core no to bi-directionally communicate with a neighboring core along each of its sides enables the array core no to pull in data from any of its neighbors as well as push (processed or raw) data to any of its neighbors. This enables a mesh communication architecture that allows for efficient movement of data throughout the collection of array and border cores no, 120 of the integrated circuit 100.

Figure 6:
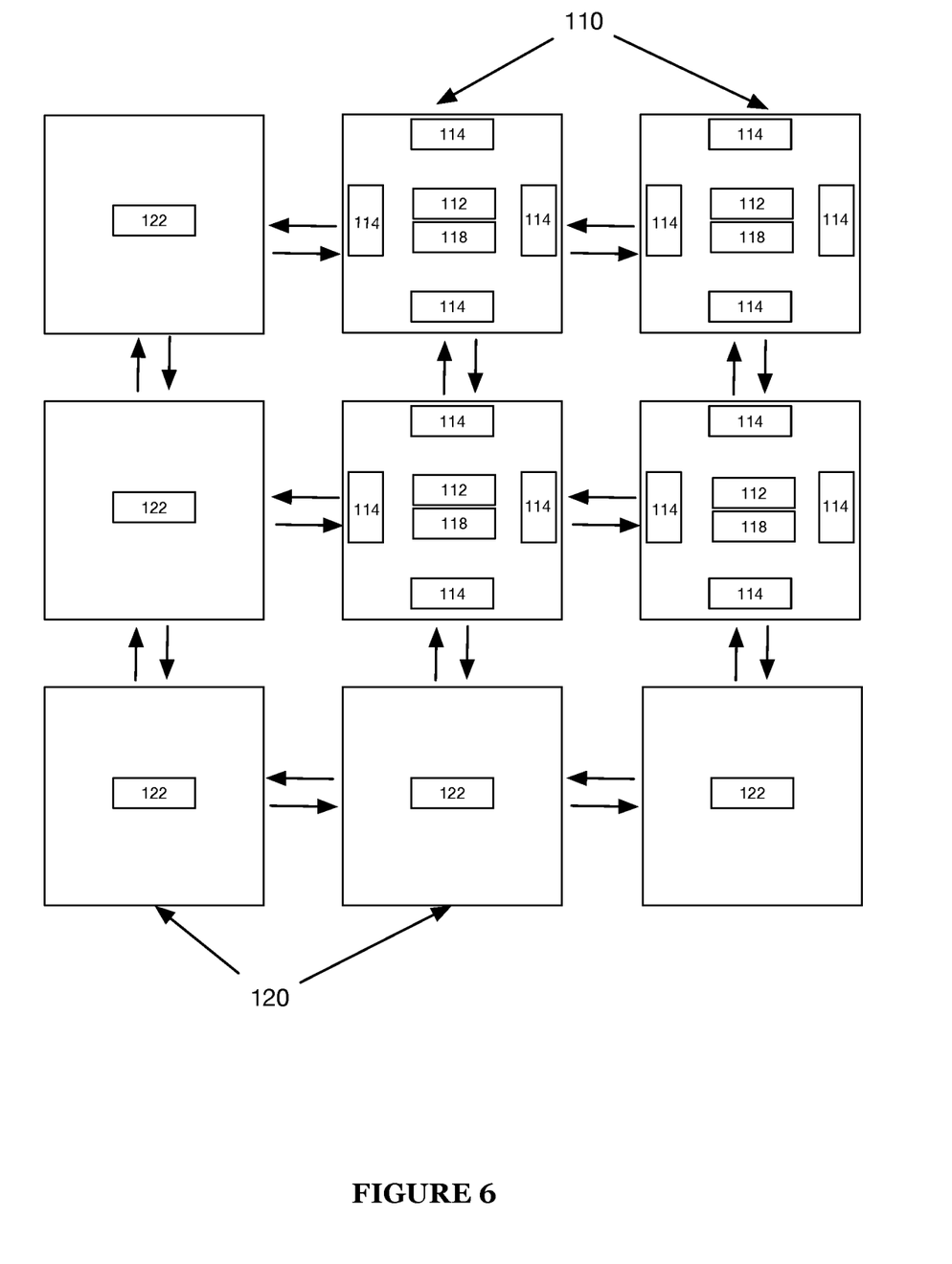
FIG. 6 illustrates example mixed block and flow diagrams for data movements and data rotations in accordance with one or more embodiments of the present application.

Each of the plurality of border cores 120 preferably includes a register file 122. The register file 122 may be configured similar to the register file 112 of an array core no in that the register file 122 may function to store large datasets, as shown by way of example in FIG. 6. Preferably, each border core 120 includes a simplified architecture when compared to an array core no. Accordingly, a border core 120 in some embodiments may not include execution capabilities and therefore, may not include multiplier-accumulators and/or an arithmetic logic unit as provided in many of the array cores 110.

In a traditional integrated circuit (e.g., a GPU or the like), when input image data (or any other suitable sensor data) received for processing compute-intensive application (e.g., neural network algorithm) within such a circuit, it may be necessary to issue padding requests to areas within the circuit which do not include image values (e.g., pixel values) based on the input image data. That is, during image processing or the like, the traditional integrated circuit may function to perform image processing from a memory element that does not contain any image data value. In such instances, the traditional integrated circuit may function to request that a padding value, such as zero, be added to the memory element to avoid subsequent image processing efforts at the memory element without an image data value. A consequence of this typical image data processing by the traditional integrated circuit results in a number of clock cycles spent identifying the blank memory element and adding a computable value to the memory element for image processing or the like by the traditional integrated circuit.

In a preferred implementation of the integrated circuit 100, one or more of the plurality of border cores 120 may function to automatically set to a default value when no input data (e.g., input sensor data) is received. For instance, input image data from a sensor (or another circuit layer) may have a total image data size that does not occupy all border core cells of the integrated circuit array 105. In such instance, upon receipt of the input image data, the one or more border cores 120 (i.e., border core cells) without input image data may be automatically set to a default value, such as zero or a non-zero constant value.

In some embodiments, the predetermined input data flow schedule generated by the dispatcher and sent to one or more of the plurality of border cores may include instructions to set to a default or a predetermined constant value. Additionally, or alternatively, the one or more border cores 120 may be automatically set to a default or a predetermined value when it is detected that no input sensor data or the like is received with a predetermined input data flow to the integrated circuit array 105. Additionally, or alternatively, in one variation, the one or more border cores 120 may be automatically set to reflect values of one or more other border cores having input sensor data when it is detected that no input sensor data or the like is received with a predetermined input data flow to the integrated circuit array 105.

Accordingly, a technical benefit achieved according to the implementation of one or more of the plurality of border cores 120 as automatic padding elements, may include increasing efficiencies in computation by one or more of the plurality of array cores no by minimizing work requests to regions of interest (or surrounding areas) of input sensor data where automatic padding values have been set. Thereby, reducing clock cycles used by the plurality of array core 110 in performing computations on an input dataset.

In a preferred implementation of the integrated circuit 100, the progression of data into the plurality of array cores no and the plurality of border cores 120 for processing is preferably based on a predetermined data flow schedule generated at the dispatcher 130. The predetermined data flow schedule enables input data from one or more sources (e.g., sensors, other NN layers, an upstream device, etc.) to be loaded into the border cores 120 and array cores 110 without requiring an explicit request for the input data from the border cores 120 and/or array cores no. That is, the predetermined data flow schedule enables an automatic flow of raw data from memory elements (e.g., main memory 160) of the integrated circuit 100 to the plurality of border cores 120 and the plurality of array cores no having capacity to accept data for processing. For instance, in the case that an array core no functions to process a first subset of data of a data load stored in its register file 112, once the results of the processing of the first subset of data is completed and sent out from the array core no, the predetermined data flow schedule may function to enable an automatic flow of raw data into the array core no that adds to the data load at the register file 112 and replaces the first subset of data that was previously processed by the array core no. Accordingly, in such instance, no explicit request for additional raw data for processing is required from the array core no. Rather, the integrated circuit 100 implementing the dispatcher 130 may function to recognize that once the array core no has processed some amount of data sourced from its register file 112 (or elsewhere) that the array core no may have additional capacity to accept additional data for processing.

Figure 3A:
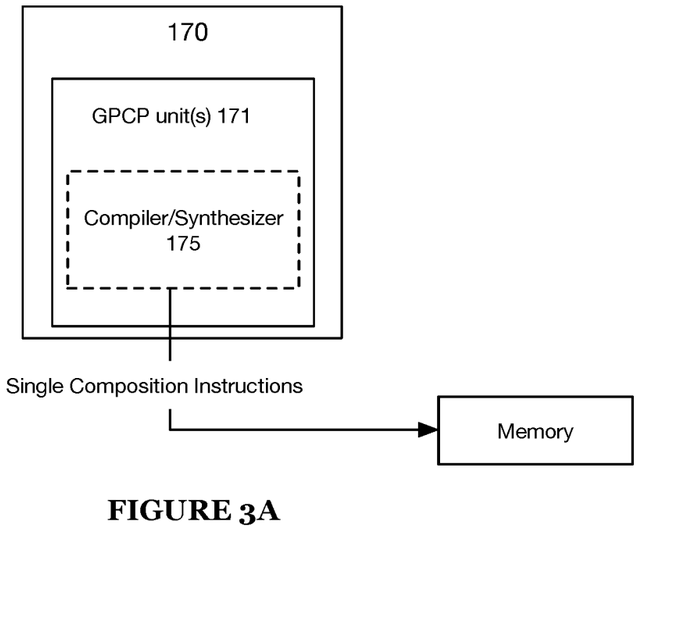
FIGS. 3A-3B illustrate example mixed block and flow diagrams for instructions generation in accordance with one or more embodiments of the present application.
Figure 3B:
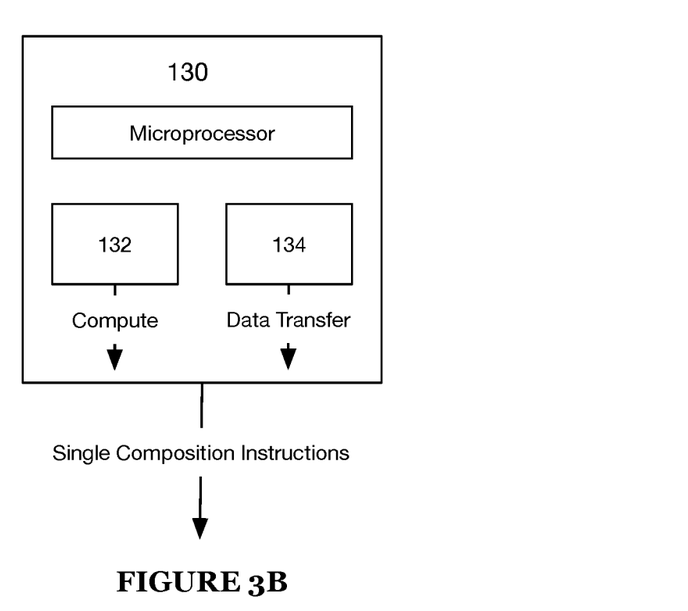

In a preferred embodiment, the integrated circuit 100 may be in operable communication with an instructions generator 170 that functions to generate computation, execution, and data movement instructions, as shown by way of example in FIGS. 3A-3B. The instructions generator 170 may be arranged off-chip relative to the components and circuitry of the integrated 100. However, in alternative embodiments, the instructions generator 170 may be cooperatively integrated within the integrated circuit 100 as a distinct or integrated component of the dispatcher 130.

Preferably, the instructions generator 170 may be implemented using one or more general purpose computers (e.g., a Mac computer, Linux computer, or any suitable hardware computer) or general-purpose computer processing (GPCP) units 171 that function to operate a compiler module 175 that is specifically configured to generate multiple and/or disparate types of instructions. The compiler module 175 may be implemented using any suitable compiler software (e.g., a GNU Compiler Collection (GCC), a Clang compiler, and/or any suitable open-source compiler or other compiler). The compiler module 175 may function to generate at least computation instructions and execution instructions as well as data movement instructions. In a preferred embodiment, at compile time, the compiler module 175 may be executed by the one or more GPCP units 171 to generate the two or more sets of instructions computation/execution instructions and data movement instructions sequentially or in parallel. In some embodiments, the compiler module 175 may function to synthesize multiple sets of disparate instructions into a single composition instruction set that may be loaded into memory (e.g., instructions buffer, an external DDR, SPI flash memory, or the like) from which the dispatcher may fetch the single composition instruction set from and execute.

In a first variation, however, once the compiler module 175 generates the multiple disparate sets of instructions, such as computation instructions and data movement instructions, the instructions generator 170 may function to load the instructions sets into a memory (e.g., memory 160 or off-chip memory associated with the generator 170). In such embodiments, the dispatcher 130 may function to fetch the multiple sets of disparate instructions generated by the instructions generator 170 from memory and synthesize the multiple sets of disparate instructions into a single composition instruction set that the dispatcher may execute and/or load within the integrated circuit 100.

In a second variation, the dispatcher 130 may be configured with compiling functionality to generate the single composition instruction set. In such variation, the dispatcher 130 may include processing circuitry (e.g., microprocessor or the like) that function to create instructions that include scheduled computations or executions to be performed by various circuits and/or components (e.g., array core computations) of the integrated circuit 100 and further, create instructions that enable a control a flow of input data through the integrated circuit 100. In some embodiments, the dispatcher 130 may function to execute part of the instructions and load another part of the instructions into the integrated circuit array 105. In general, the dispatcher 130 may function as a primary controller of the integrated circuit 100 that controls and manages access to a flow (movement) of data from memory to the one or more other storage and/or processing circuits of the integrated circuit 100 (and vice versa). Additionally, the dispatcher 130 may schedule control execution operations of the various sub-controllers (e.g., periphery controllers, etc.) and the plurality of array cores 110.

In some embodiments, the processing circuitry of the dispatcher 130 includes disparate circuitry including a compute instruction generator circuit 132 and a data movement instructions generator circuit 134 (e.g., address generation unit or address computation unit) that may independently generate computation/execution instructions and data transfers/movements schedules or instructions, respectively. Accordingly, this configuration enables the dispatcher 130 to perform data address calculation and generation of computation/execution instructions in parallel. The dispatcher 130 may function to synthesize the output from both the computer instructions generator circuit 132 and the data movement instructions generator circuit 134 into a single instructions composition that combines the disparate outputs.

The single instructions composition generated by the instructions generator 170 and/or the dispatcher 130 may be provided to the one or more downstream components and integrated circuit array 105 and allow for computation or processing instructions and data transfer/movement instructions to be performed simultaneously by these various circuits or components of the integrated circuit 100. With respect to the integrated circuit array 105, the data movement component of the single instructions composition may be performed by one or more of periphery controllers 140, 150 and compute instructions by one or more of the plurality of array cores 110. Accordingly, in such embodiment, the periphery controllers 140, 150 may function to decode the data movement component of the instructions and if involved, may perform operations to read from or write to the dual FIFOs 149, 159 and move that data from the dual FIFOs 149, 159 onto a data bus to the integrated circuit (or vice versa). It shall be understood that the read or write operations performed by periphery controllers 140, 150 may performed sequentially or simultaneously (i.e., writing to and reading from dual FIFOs at the same time).

It shall be noted that while the compute instructions generator circuit 132 and the data movement instructions generator circuit 134 are preferably separate or independent circuits, in some embodiments the compute instructions generator circuit 132 and the data movement instructions generator circuit 134 may be implemented by a single circuit or a single module that functions to perform both compute instructions generation and data movement instruction generation.

In operation, the dispatcher 130 may function to generate and schedule memory addresses to be loaded into one or more the periphery load store 145 and the periphery load store 155. The periphery load stores 145, 155 preferably include specialized execution units that function to execute all load and store instructions from the dispatcher 130 and may generally function to load or fetch data from memory or storing the data back to memory from the integrated array core. The first periphery load store 145 preferably communicably and operably interfaces with both the first plurality of dual FIFOs 149 and the first periphery memory 147. The first and the second periphery memory 147, 157 preferably comprise on-chip static random-access memory.

In configuration, the first periphery load store 145 may be arranged between the first plurality of dual FIFOs 149 and the first periphery memory 147 such that the first periphery load store 145 is positioned immediately next to or behind the first plurality of dual FIFOs 149. Similarly, the second periphery load store 155 preferably communicably and operably interfaces with both the second plurality of dual FIFOs 159 and the second periphery memory 157. Accordingly, the second periphery load store 155 may be arranged between the second plurality of dual FIFOs 159 and the second periphery memory 157 such that the second periphery load store 155 is positioned immediately next to or behind the second plurality of dual FIFOs 159.

In response to memory addressing instructions issued by the dispatcher 130 to one or more of the first and the second periphery load stores 145, 155, the first and the second periphery load stores 145, 155 may function to execute the instructions to fetch data from one of the first periphery memory 147 and the second periphery memory 157 and move the fetched data into one or more of the first and second plurality of dual FIFOs 149, 159. Additionally, or alternatively, the dual FIFOs 149, 159 may function to read data from a data bus and move the read data to one or more of the respective dual FIFOs or read data from one or more of the dual FIFOs and move the read data to a data bus. Similarly, memory addressing instructions may cause one or more of the first and the second periphery load stores 145, 155 to move data collected from one or more of the plurality of dual FIFOs 149, 159 into one of the first and second periphery memory 147, 157.

Each of the first plurality of dual FIFOs 149 and each of the second plurality of dual FIFOs 159 preferably comprises at least two memory elements (not shown). Preferably, the first plurality of dual FIFOs 149 may be arranged along a first side of the integrated circuit array 105 with each of the first plurality of dual FIFOs 149 being aligned with a row of the integrated circuit array 105. Similarly, the second plurality of dual FIFOs 159 may be arranged along a second side of the integrated circuit array 105 with each of the second plurality of dual FIFOs 159 being aligned with a column of the integrated circuit array 105. This arrangement preferably enables each border 120 along the first side of the integrated circuit array 105 to communicably and operably interface with at least one of the first periphery controllers 145 and each border 120 along the second side of the integrated circuit array 105 to communicably and operably interface with at least one of the second periphery controllers 155.

While it is illustrated in at least FIG. 1 that there are a first and second plurality of dual FIFOs, first and second periphery controllers, first and second periphery memories, and first and second load stores, it shall be noted that these structures may be arranged to surround an entire periphery of the integrated circuit array 105 such that, for instance, these components are arranged along all (four) sides of the integrated circuit array 105.

The dual FIFOs 149, 159 preferably function to react to specific instructions for data from their respective side. That is, the dual FIFOs 149, 159 may be configured to identify data movement instructions from the dispatcher 130 that is specific to either the first plurality of dual FIFOs 149 along the first side or the second plurality of dual FIFOs along the second side of the integrated circuit array 105.

According to a first implementation, each of the dual FIFOs may use first of the two memory elements to push data into the integrated circuit array 105 and second of the two memory elements to pull data from the integrated circuit array 105. Thus, each dual FIFO 149, 159 may have a first memory element dedicated for moving data inward into the integrated circuit array 105 and a second memory element dedicated for moving data outward from the integrated circuit array 105.

According to a second implementation, the dual FIFOs may be operated in a stack (second) mode in which each respective dual FIFO functions to provide data into the integrated circuit array 105 in a predetermined sequence or order and collect the data from the integrated circuit array 105 in the same predetermined sequence or order.

Additionally, the integrated circuit 100 preferably includes main memory 160 comprising a single unified memory. The main memory 160 preferably functions to store data originating from one or more sensors, system-derived or generated data, data from one or more integrated circuit layers, data from one or more upstream devices or components, and the like. Preferably, the main memory 160 comprises on-chip static random-access memory or the like.

Additionally, or alternatively, main memory 160 may include multiple levels of on-die (on-chip) memory. In such embodiments, the main memory 160 may include multiple memory (e.g., SRAM) elements that may be in electrical communication with each other and function as a single unified memory that is arranged on a same die as the integrated circuit array 105.

Additionally, or alternatively, main memory 160 may include multiple levels of off-die (off-chip) memory (not shown). In such embodiments, the main memory 160 may include multiple memory (e.g., DDR SRAM, high bandwidth memory (HBM), etc.) elements that may be in electrical communication with each other and function as a single unified memory that is arranged on a separate die than the integrated circuit array.

It shall be noted that in some embodiments, the integrated circuit 100 includes main memory 160 comprising memory arranged on-die and off-die. In such embodiments, the on-die and the off-die memory of the main memory 160 may function as a single unified memory accessible to the on-die components of the integrated circuit 100.

Each of the first periphery memory 147 and the second periphery memory 157 may port into the main memory 160. Between the first periphery memory 147 and the main memory 160 may be arranged a load store unit that enables the first periphery memory 147 to fetch data from the main memory 160. Similarly, between the second periphery memory 157 and the main memory 160 may be arranged a second load store unit that enables the second periphery memory 157 to fetch data from the main memory 160.

It shall be noted that the data transfers along the memory hierarchy of the integrated circuit 100 occurring between dual FIFOs 149, 159 and the load stores 145, 155, between the load stores 145, 155 and the periphery memory 147, 157, and the periphery memory 147, 157 and the main memory 160 may preferably be implemented as prescheduled or predetermined direct memory access (DMA) transfers that enable the memory elements and load stores to independently access and transfer data within the memory hierarchy without direct invention of the dispatcher 130 or some main processing circuit. Additionally, the data transfers within the memory hierarchy of the integrated circuit 100 may be implemented as 2D DMA transfers having two counts and two strides thereby allowing for efficient data access and data reshaping during transfers. In a preferred embodiment, the DMA transfers may be triggered by a status or operation of one or more of the plurality of array cores 110. For instance, if an array core is completing or has completed a processing of first set of data, the completion or near-completion may trigger the DMA transfers to enable additional data to enter the integrated circuit array 105 for processing.

2. Method for Accelerating Computations and Operations of a Processing Core

Figure 2:
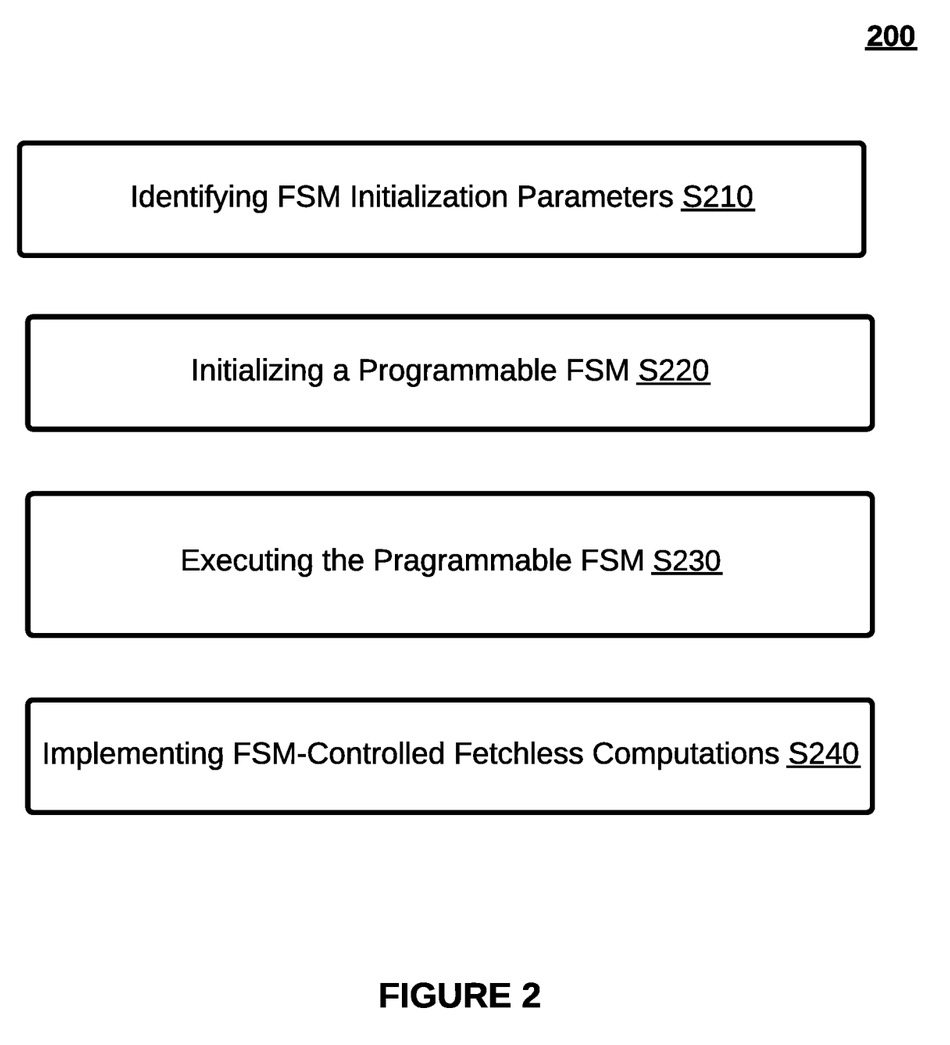
FIG. 2 illustrates an example method 200 in accordance with one or more embodiments of the present application.

As shown by way of example in FIG. 2, a method 200 for a fetchless acceleration of computational loops and operations of a processing core includes computing FSM initialization parameters S210, encoding a programmable FSM using FSM initialization parameters S220, executing the programmable FSM S230, and performing FSM-controlled fetchless computations S240.

2.10 Computing FSM Initialization Parameters

S210, which includes identifying FSM initialization parameters, may function to determine each of a plurality of distinct FSM initialization parameters for encoding and/or programming a target programmable FSM of an integrated circuit. In one or more embodiments, S210 may function to generate the FSM initialization parameters based at least on attributes of neural network computations of a neural network program or application. Additionally, or alternatively, in some embodiment, S210 may function to identify a subset of the FSM initialization parameters based at least on attributes of an n-dimensional matrix or vector of data, such as an n-dimensional tensor.

In one or more embodiments, the FSM initialization parameters may relate to a set of distinct initialization or parameters values that may be encoded to one or more circuits of a programmable FSM that enables the programmable FSM to control operations of computational circuits of one or more processing cores for an accelerated and reduced power operation of the processing cores when performing computations on data.

In one embodiment, identifying the FSM initialization parameters may include implementing a neural network compiler or similar software applications that preferably functions to generate instructions for the programmable FSM and various other circuits of an integrated circuit. In such embodiments, at compile time, a software compiler may take in as input a neural network graph or neural network task graph (or the like) to generate the FSM initialization parameters/instructions. In one implementation, once the software compiler generates the FSM initialization parameters, S210 may function to store the FSM initialization parameters in an instructions buffer and at runtime, the FSM initialization parameters may be encoded to the programmable FSM.

In one or more embodiments, generating the FSM initialization parameters include generating a starting memory address parameter for each computation circuit (e.g., multiply accumulator circuit of a processor core) of a processing core. The starting memory address parameter preferably relates to a memory address pointer (e.g., register file pointer), such as a tensor offset, that identifies a head of input data within an n-dimensional matrix or vector being stored on a local memory of a processing core. In one embodiment, a target programmable FSM may be in control signal communication with a plurality of distinct processing cores and each distinct processing core having a local memory (or a register file relatively larger than registers or data ports or the like) and one or more multiply accumulator circuits (MACs).

In one or more embodiments, generating the FSM initialization parameters includes generating a convolutional type parameter for each computation circuit of a processing core. The convolutional type parameter preferably relates to a convolutional filter size (e.g., 3×3, 5×5, and the like). In a preferred embodiment, the convolutional type parameter may be a value (e.g., 0, 1, 2, 3, and the like) that maps to a distinct convolutional filter size. As a non-limiting example, a convolutional type parameter value of 1 may map to a 3×3 convolution filter size and a value of 2 may map to a 5×5 convolution filter size. It shall be recognized that the convolutional type parameter values may be mapped to a convolution filter of any size.

In one or more embodiments, generating the FSM initialization parameters may include generating iteration parameters for each computer circuit of a processing core. The iteration parameters, in some embodiments, may include at least two distinct parameters including a first iteration parameter (e.g., center channel loop) that may inform a computation circuit of a number of instances, cycles, or loops that the computation circuit should perform a multiply-accumulate computation and a second iteration parameter (e.g., a data rotation loop) that may additionally inform a movement of input data from a local memory (e.g., register file of processing core) to the data ports of its neighboring processing cores for computation, and a number of computations to be performed by the computation circuit.

Additionally, or alternatively, in one or more embodiments, the second iteration parameter or data rotation loop parameter may include at least two distinct parameter components or values and a required executional sequence. In a non-limiting example, the second iteration parameter may include a first parameter value that informs a type of data movement or rotation together with a starting data movement location, e.g., [East 180°, second parameter value]. In such an embodiment, an indication of a starting location or starting data port (e.g., East data port) for data movement may be indicated using cardinal directions together with an indication of a degree of rotation of input data stored within the starting data port to a destination data port of a processing core. It shall be recognized that the first parameter value could be separated into two distinct parameter values that operate together to identify a storage location of target input data and a required movement of the target input data to a particular neighboring processing core. The second parameter value of the second iteration parameter may include a number of cycles of a (convolutional) computation (e.g., [East 180°, 7] to be performed by a given computation circuit (e.g., a MAC unit). In some embodiments, the second iteration parameter and/or the first iteration parameter may additionally include a MAC unit identifier, such as East, North, West, South MAC unit or the like, which depends on a configuration of a given processing core. It shall be recognized that any suitable identifier may be used.

2.20 Encoding/Programming the Programmable FSM

S220, which includes initializing the programmable FSM, may function to encode a programmable FSM using at least the FSM initialization parameters. In a preferred embodiment, the programmable FSM may be implemented by a plurality of distinct register files or processor registers. Accordingly, at runtime, S220 may function to program or encode the register files of the programmable FSM using the FSM initialization parameters as encoding values.

Figure 4:
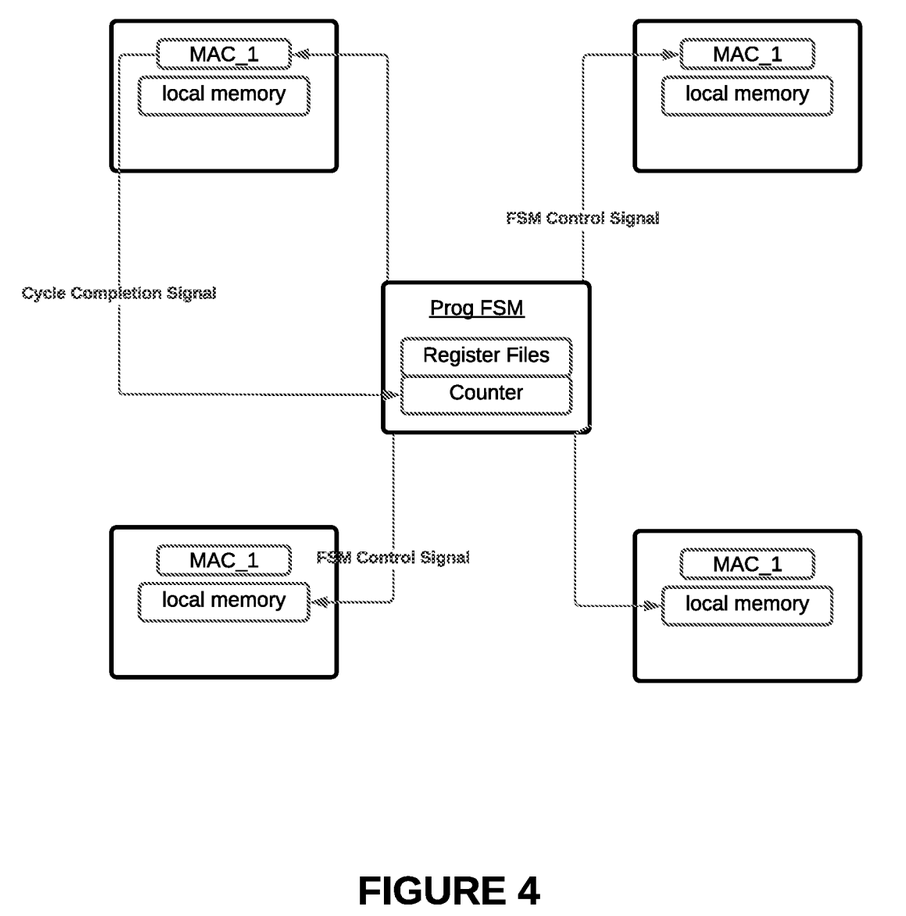
FIG. 4 illustrates an example mixed block and flow schematic for fetchless computations in accordance with one or more embodiments of the present application.

In a preferred embodiment, initializing or configuring the programmable FSM may include encoding each distinct FSM initialization parameter to a distinct register file or a distinct set of registers of the programmable FSM. In such preferred embodiment, the programmable FSM may include one or more of a start address register, convolution type register, and iteration registers. Each of the start address register, the convolution type register, and iteration registers may be implemented by the programmable FSM to generate command signals, control signals, and programming signals to one or more computation circuits of one or more processing cores, as shown by way of example in FIG. 4.

Memory Start Address|Start Address Register

In a preferred implementation, the programmable FSM comprises a register file configured to store a memory start address value or pointer. The register file may be referred to herein as a start address register file. Accordingly, at runtime or the like, initializing the programmable FSM may include programming the start address register file and, in such embodiments, S220 may function to encode the start address register file of the programmable FSM using a start address value of the FSM initialization parameters. Once encoded, in one or more embodiments, the start address register file of the programmable FSM may include a memory address location or offset of a tensor that identifies a head of the input data for a given convolution computation by a processing core.

In a second implementation, at runtime, S220 may function to directly encode a local register file of a processing core with the start address parameter value. In such embodiments, S220 may function to bypass encoding the programmable FSM with the start address parameter value and distribute the start address parameter value or instructions to each of the final or end targets of the start address parameter instructions.

In one or more embodiments, a programmable FSM may include a plurality of distinct start address register files based on a number of processing cores that the programmable FSM may be in control or command signal communication. That is, the programmable FSM may be hard wired to each of the multiple distinct processing cores and may function to control computations across the multiple distinct processing cores. As such, in these embodiments, the programmable FSM may include a distinct start address register file for each of the multiple distinct processing cores. Accordingly, S220 may function to encode each of the plurality of distinct start address register files of the programmable FSM with a distinct start address parameter value for distinct computations of each of the multiple distinct processing cores.

Convolution Type Parameter|Convolution Type Register

In a preferred embodiment, the programmable FSM comprises a register file configured to store a convolution type parameter value. The register file may be referred to herein as a convolution register file. At runtime, in such preferred embodiment, S220 may function to encode the convolution register file using a convolution parameter value of the FSM initialization parameters. In an encoded state, the convolution register file of the programmable FSM may include a single bit or n-bit value that maps to one of a plurality of distinct convolution filter sizes.

In one or more embodiments, a programmable FSM may include a plurality of distinct convolution register files based on a number of processing cores or a number of computing circuits (e.g., a number of MACs) that the programmable FSM may be in control or command signal communication. That is, the programmable FSM may be hard wired to each of the multiple distinct processing cores or MACs and may function to control computations across the multiple distinct processing cores. As such, in these embodiments, the programmable FSM may include a distinct convolution register file for each of the multiple distinct processing cores. Accordingly, S220 may function to encode each of the plurality of distinct convolution register files of the programmable FSM with a distinct convolution type parameter value for distinct computations of each of the multiple distinct processing cores.

Center Channel Iterations+Data Rotation Iterations|Iteration Registers

Figure 5:
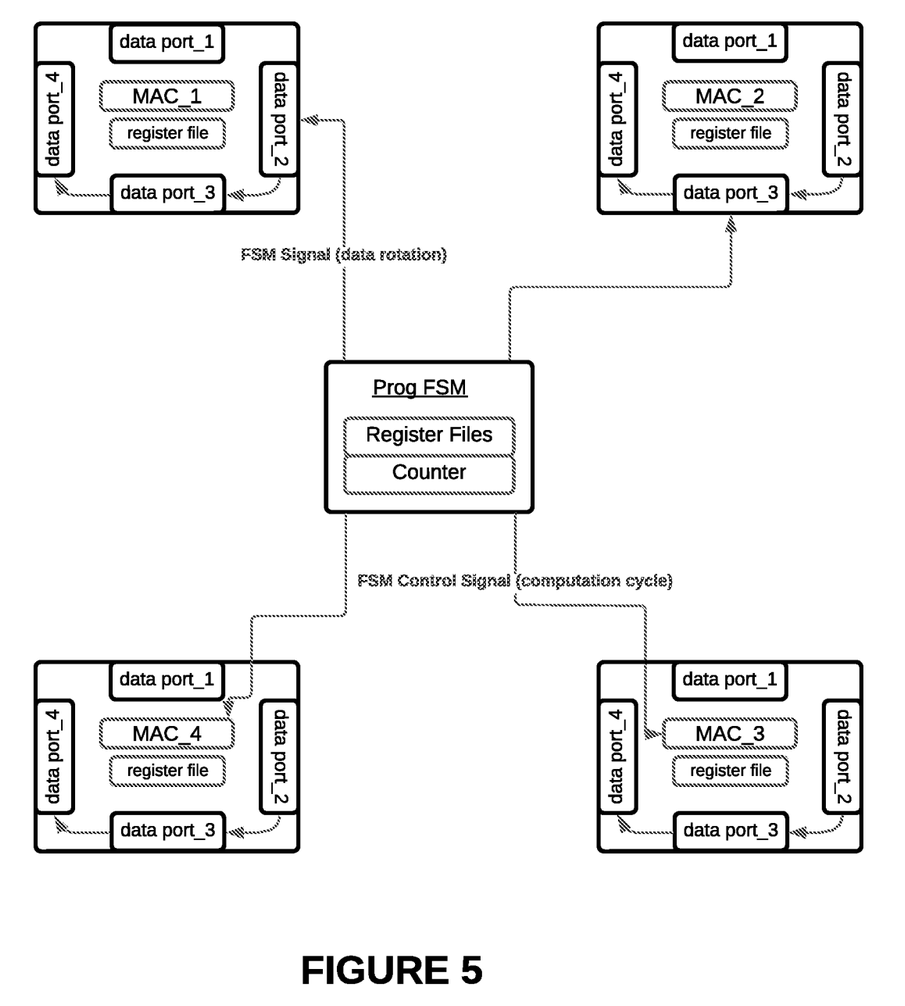
FIG. 5 illustrates an example mixed block and flow schematic for fetchless computations and data rotations in accordance with one or more embodiments of the present application.

In a preferred embodiment, the programmable FSM comprises a set of register files configured to store iteration parameter values. In such preferred embodiment, the set of register files may include at least two register files including a first register file (e.g., center channel register file) and a second register file (e.g., rotation register file). In one or more embodiments, at runtime, S220 may function to encode the first register file with a center channel parameter value that identifies a number of loops or instances of a multiply-accumulate computation for a given convolution that should be executed by reading data from a local memory of a processing core. Additionally, or alternatively, at runtime, S220 may function to encode the second register file with a rotation parameter value that may identify a series of operations by a processing core including a number of rotations of movements of data from neighboring processing cores or data ports, as shown by way of example in FIG. 5, to the input data ports of a processing core and a number or loops of multiply-accumulate computations on this input data of a given processing core.

In one or more embodiments, a programmable FSM may include a plurality of distinct iteration register files based on a number of processing cores that the programmable FSM may be in control or command signal communication. That is, the programmable FSM may be hard wired to each of the multiple distinct processing cores or MACs and may function to control a number of iterations of computations across the multiple distinct processing cores. As such, in these embodiments, the programmable FSM may include a distinct iteration register files for each of the multiple distinct processing cores. Accordingly, S220 may function to encode each of the plurality of distinct iteration register files of the programmable FSM with a distinct iteration parameter value for distinct computations of each of the multiple distinct processing cores.

2.30 Controlling Convolutions|Executing the Programmable FSM

S230, which includes executing the programmable FSM, may function to execute or implement the programmable FSM to control operations of one or more processing cores of an integrated circuit in a fetchless manner. In a preferred embodiment, once the programmable FSM is encoded with the FSM initialization parameters, S230 may function to execute a start instruction that enables the programmable FSM to compute and broadcast control signals to each of the processing cores under its control without fetching instructions from memory (e.g., an instructions buffer or the like). That is, in such preferred embodiments, an enablement and/or start of the programmable FSM is directly predicated on an initial encoding of the programmable FSM with the FSM initialization parameters.

In use, the programmable FSM may function to produce control signals or commands that inform computational and/or data movement (datapath) operations of a target processing core without fetching instructions. Accordingly, an operation of the programmable FSM may be a fetchless operation in which the computation control encoding of the programmable FSM together with a locality of data stored on the processing cores of an array of processing cores mitigates or eliminates a requirement for the processing cores or related circuits to perform fetches of computation instructions (e.g., e.g., reads, writes, compute, etc.) from memory and fetches of input data.

In a preferred embodiment, once the programmable FSM is encoded with FSM initialization parameters, the components of a processing core controlled by the programmable FSM may function to complete a full convolutional computation or the like, which may include multiple loops or iterations of a convolution, without intervening or contemporaneous fetches of instructions. That is, with an operation of the programmable FSM for controlling the operations of the processing cores, the operations of the processing may be fetchless operations not dependent on periodically fetching instructions but dependent on one or more states of the programmable FSM and FSM initialization parameters stored in the register files of the programmable FSM.

2.40 Fetchless Computations

S240, which includes performing fetchless computations, may function to fetchlessly execute a plurality of distinct computations and data movements by at least one processing core of an integrated circuit based on control signals generated by the programmable FSM. In a preferred embodiment, an implementation of the programmable FSM may be initiated by an execution of a distinct FSM start instruction. In one embodiment, the FSM start instruction includes a Boolean switch or the like that may be used to initiate an initial computation, such as a convolution computation.

Reading Memory Start Address

In one or more embodiments, in response to an execution of the FSM start instruction or execution of a Boolean switch, a computation circuit (e.g., a MAC) may function to read input data beginning at a start memory address or starting offset location of a tensor based on the start memory parameter value of the memory address register file of the programmable FSM. In a preferred embodiment, the memory address register file of the programmable FSM may include a pointer to a head of input data stored in a local memory of a processing core (i.e., on-processing core memory). In such preferred embodiment, the processing core may include one or more computation circuits, such as multiply accumulators, that may be in direct read-access communication with a local memory of the processing core. In one or more embodiments, an n-dimensional matrix or vector of data, such as a tensor of data, may be stored on the local memory of the processing core. A read of the memory start address parameter or memory address pointer by the computation circuit informs the computation circuit of a position within the n-dimensional data structure to begin reading in data for iterative computations, such as convolutions. Depending on a convolution filter size and a size of the n-dimensional data to be read, the computation circuit of the processing core may perform multiple iterations of a computation, such as multiple convolutional computations.

Selecting or Implementing Parameter-Informed Convolution Filter Size

Additionally, or alternatively, based on an implementation of the programmable FSM or execution of the FSM start instructions, S240 may function to cause a computation circuit to read the convolution register file of the programmable FSM to identify a convolution filter size for performing computations on input data. In one or more embodiments, the convolution register file may include one of a plurality of distinct convolution type parameter values that each map to a distinct convolution filter size (e.g., 3×3, 5×5, 7×7, of the like). Upon reading the register file, the computation circuit may perform convolutional computations using the distinct convolution filter size based on the convolution type parameter value.

In an alternative implementation, the programmable FSM may function to send a convolution type command or control signal to a computation circuit of a processing core based on the convolution parameter value of the convolution register file of the programmable FSM.

It shall be recognized that, in one or more embodiments, the computation circuits, such as the MACs, of a processing core may be hardcoded (i.e., hardware or circuits specifically configured) to perform convolutional computations with one or more distinct convolution filter sizes. In one embodiment, a computation circuit or MAC of a processing core may be hardcoded to perform convolutional computations using a single convolution filter size. In such embodiments, if the read of the convolution register file or a convolution control signal from the programmable FSM includes a convolution parameter value that maps to the computation circuit's convolution filter size, the computation circuit may function to automatically perform the convolutional computation on an input dataset; otherwise, if the convolution parameter value or control signal does not map to or match the computation circuit's convolution filter size, the computation may not write out its results or may bypass the computation (e.g., maintain an idle state).

Additionally, or alternatively, in one or more embodiments, in response to reading the convolution register file of the programmable FSM or receiving a convolution control signal from the programmable FSM, S240 may function to cause a computation circuit of a target processing core to toggle to an intended convolution filter size based on the convolution parameter value derived from the convolution control signal or read from the convolution register file of the programmable FSM. In such embodiments, the computation circuit, such as a MAC, may be hardcoded to perform multiple distinct convolutional computations. Accordingly, based on identifying a convolution parameter value or instruction from the programmable FSM, S240 may function to cause the MAC to select a distinct state of operation of a plurality of distinct states of operation or a distinct convolution filter size of a plurality of distinct convolution filter sizes that maps to the convolution parameter value associated with the convolution control signal or convolution register file.

Accordingly, in response to either reading the convolution register file of the programmable FSM or receiving the convolution control signal from the programmable FSM, the computation circuit may function to perform a convolution computation or the like using a selected convolutional filter size.

Iteration Control Signals

Additionally, or alternatively, based on an implementation of the programmable FSM or execution of the FSM start instructions, S240 may function to cause a computation circuit of a processing core to iteratively perform a computational loop, such as a convolutional loop.

In one or more embodiments, an execution of an initial computation of a computational loop by the computation circuit may be initiated by the execution of the FSM start instructions. Alternatively, the execution of the initial computation of the computational loop by the computation circuit may be initiated by a start control signal transmitted by the programmable FSM directly to the computation circuit. Once a first computation of a computational loop is performed and results thereof written to memory, the programmable FSM may identify a state of the first computation and generate a convolution control signal based on the state of the first computation and an iteration parameter value of an iteration register file of the programmable FSM.

In one or more embodiments, the programmable FSM may include or implement a counter circuit in association with the iteration register file. In a first implementation, the counter circuit may be initialized or set based on the iteration parameter value of the iteration register file. For example, if the iteration register file stores an iteration parameter value of seven (7), S240 may function to program or set the counter circuit to seven. In this first implementation, each computation or write signal by the computation circuit may cause the counter circuit to decrement by one (1). In such embodiment, the programmable FSM may evaluate a state of the counter circuit against logic that, if satisfied (or not), may cause the programmable FSM to assert an iteration control signal until the seven iterations of the computational loop are completed by the computation circuit. In a second implementation, the counter circuit may be set to an initial value, such as zero (0), and incremented based on each computation completed in a computation loop or each write to memory by the computation circuit. In this second implementation, S240 may implement the programmable FSM to evaluate a state of the counter circuit against the iteration parameter value and continue generation of iteration control signals for causing the computation circuit to perform an iteration of a computational loop until a value of the counter circuit matches the convolution parameter value.

It shall be recognized that, in a preferred embodiment, the programmable FSM may include or may function to implement at least two distinct iteration register files and associated distinct counter circuits for each of the at least two distinct iteration register files. In this preferred embodiment, a first iteration register file may be configured to store an iteration parameter value that delineates the number of iterations or cycles/loops to be performed by a computation circuit, such as a MAC, using or reading the input data actively stored in the local memory of the MAC. A second iteration register file may be configured to store an iteration parameter value that delineates a data movement, which may include a first bit identifying one or more destination sides of a processing core to which local data may be sent to neighboring processing cores, and a second bit identifying a data movement, such as a degree or angle of a rotational movement of input data from neighboring processing cores to the output data to other neighboring processing cores. In such embodiments, once the data may be positioned or moved to the designated destination side, the continued execution of the iteration parameter value of the second register file may include executing an iteration of a computational loop on the input data.

Additionally, or alternatively, in one or more embodiments, executing computations on an array of processing cores may include an execution of one or more input bit movement instructions including, but not limited to, an input bit rotation, an input bit core hop, an input swap, and/or the like.

The systems and methods of the preferred embodiment and variations thereof can be embodied and/or implemented at least in part as a machine configured to receive a computer-readable medium storing computer-readable instructions. The instructions are preferably executed by computer-executable components preferably integrated with the system and one or more portions of the processor and/or the controller. The computer-readable medium can be stored on any suitable computer-readable media such as RAMs, ROMs, flash memory, EEPROMs, optical devices (CD or DVD), hard drives, floppy drives, or any suitable device. The computer-executable component is preferably a general or application specific processor, but any suitable dedicated hardware or hardware/firmware combination device can alternatively or additionally execute the instructions.

Although omitted for conciseness, the preferred embodiments include every combination and permutation of the implementations of the systems and methods described herein.

As a person skilled in the art will recognize from the previous detailed description and from the figures and claims, modifications and changes can be made to the preferred embodiments of the invention without departing from the scope of this invention defined in the following claims.

What is claimed:

1. A method for implementing fetchless acceleration of computational loops on an integrated circuit, the method comprising:
    identifying, by a compiler, finite state machine (FSM) initialization parameters based on computational requirements of a computational loop within a neural network graph;
    initializing a programmable FSM based on the FSM initialization parameters, wherein the FSM initialization parameters include a loop iteration parameter comprising a number of computation cycles of the computational loop;
    at runtime, executing the programmable FSM to enable fetchless computations by:
        (i) generating, by the programmable FSM, a plurality of computational loop control signals including a distinct computation loop control signal for each of the number of computation cycles of the computational loop based on the loop iteration parameter; and
        (ii) controlling, by the programmable FSM, an execution of a plurality of computation cycles of a computational circuit performing the computational loop based on transmitting the plurality of computational loop control signals until the number of computation cycles of the computation loop are completed.

2. The method according to claim 1, wherein
the FSM initialization parameters further includes
    a loop iteration and data movement parameter comprising (a) a distinct number of computation cycles of the computation loop and (b) at least one data movement instruction that, when executed, moves input data from a register file of a processing core to data input ports of neighboring processing cores.

3. The method according to claim 2, wherein
at runtime, the programmable FSM causes an execution of the computational loop based on the loop iteration parameter, and
subsequently, the programmable FSM causes an execution of one or more computational loops based on the loop iteration and data movement parameter.

4. The method according to claim 2, wherein
at runtime, the programmable FSM produces:
    a first set of control signals of the plurality of computational loop control signals for executing the computational loop based on the loop iteration parameter; and
    in response to completing the computational loop based on the loop iteration parameter, a second set of control signals of the plurality of computational loop control signals for executing (a) the distinct number of computation cycles of the computational loop and (b) the at least one data movement instruction based on the loop iteration and data movement parameter.

5. The method according to claim 1, wherein
implementing the programmable FSM includes:
    generating, by the programmable FSM, a data movement control signal for each distinct number of computation cycles of the computation loop based on the loop iteration and data movement parameter.

6. The method according to claim 5, wherein
controlling the execution of the plurality of computation cycles of the computational circuit includes transmitting, by the programmable FSM, the data movement control signal for each distinct number of computation cycles until the distinct number of computation cycles of the computation loop are completed.

7. The method according to claim 1, wherein
initializing the programmable FSM based on the FSM initialization parameters includes encoding a starting memory address parameter to a start memory address register file accessible to one or more computational circuits controllable by the programmable FSM.

8. The method according to claim 7, wherein
the starting memory address parameter comprises a register file pointer that points to a head of the input data at a location within an n-dimensional memory stored within at least one processing core controllable by the programmable FSM.

9. The method according to claim 1, wherein
initializing the programmable FSM based on the FSM initialization parameters includes encoding a convolution filter size parameter to a convolution register file of at least one processing core controllable by the programmable FSM.

10. The method according to claim 9, wherein
the convolution filter size parameter comprises a value that maps to one of a plurality of distinct convolutional filter sizes for a given convolutional computation by a multiply accumulator circuit of the at least one processing core.

11. The method according to claim 1, wherein
initializing the programmable FSM based on the FSM initialization parameters includes encoding the loop iteration parameter to a combination of distinct iteration register files of at least one processing core controllable by the programmable FSM.

12. The method according to claim 1, wherein:
at runtime, the programmable FSM produces the plurality of controls signals causing an execution of an N-way multiply accumulate with computation weights and computation input data,
N relates to a number of distinct multiply accumulate circuits concurrently executing a distinct computational loop, and
N is greater than one.

13. The method according to claim 1, wherein
if convolutional filter size parameter of the FSM initialization parameters includes a value that maps to one of a plurality of distinct convolutional filter sizes that is greater than a 1×1 convolutional filter size, the programmable FSM broadcasts input data pointed to by a starting memory address parameter to a collection of processing cores in neighboring proximity.

14. A method comprising:
identifying, by a compiler, finite state machine (FSM) initialization parameters based on computational requirements of a convolutional loop within a neural network graph;
initializing a programmable FSM based on the FSM initialization parameters, wherein the FSM initialization parameters include a loop iteration parameter comprising a number of multiply-accumulate computation cycles of the convolutional loop;
at runtime, implementing the programmable FSM to enable fetchless computations by:
 (i) generating, by the programmable FSM, a plurality of convolutional loop control signals based on the loop iteration parameter; and
 (ii) controlling, by the programmable FSM, an execution of a plurality of multiply-accumulate computation cycles of a multiply accumulator circuit (MAC) performing the convolutional loop based on transmitting the plurality of convolutional loop control signals until the number of multiply-accumulate computation cycles of the computational loop are completed.

15. The method according to claim 14, wherein
initializing the programmable FSM based on the FSM initialization parameters includes:
 (i) programming a starting memory address parameter at a start memory address register file accessible to the MAC controllable by the programmable FSM;
 (ii) programming a convolution filter size parameter at a convolution register file accessible to the MAC controllable by the programmable FSM; and
 (iii) programming iteration parameters at one or more iteration registers file accessible to the programmable FSM.

16. The method according to claim 14, wherein
the programmable FSM is in direct command signal communication with a plurality of distinct MACs operating on each of a plurality of distinct processing cores.

17. The method according to claim 16, further comprising:
identifying, by the compiler, FSM initialization parameters includes:
 computing a memory start address parameter including a memory address location within a local memory of each of the plurality of distinct processing cores.

18. A method for implementing FSM-controlled convolutional computations on an integrated circuit, the method comprising:
identifying FSM programming instructions based on a neural network graph;
configuring a programmable FSM based on the FSM programming instructions, wherein the programmable FSM controls:
 (a) operations of multiply accumulators (MACs) of a plurality of distinct processing cores, and
 (b) data movement operations of data ports of the plurality of distinct processing cores; and
wherein configuring the programmable FSM includes:
 (1) programming a starting memory address value to an address register file accessible to MACs controllable by the programmable FSM,
 (2) programming a convolutional filter size to a convolutional register file associated with the FSM, and
 (3) programming at least one iteration register file associated with the programmable FSM with an iteration value identifying a number of cycles of a convolutional loop performed by at least one of the MACs; and
executing a Boolean switch based on the initialization of the programmable FSM that starts an operation of the programmable FSM for generating control signals to the MACs for automatically executing distinct convolutional loops.

* * * * *